United States Patent
O'Brien (10) Patent No.: US 6,636,530 B1
(45) Date of Patent: Oct. 21, 2003

(54) DIGITAL AUDIO TELEPHONY OVER IP NETWORK COMPRESSION

(75) Inventor: Royal O'Brien, Jacksonville, FL (US)

(73) Assignee: Digital Interactive Streams, Inc., Jacksonville, FL (US)

( * ) Notice: Subject to any disclaimer, the term of this patent is extended or adjusted under 35 U.S.C. 154(b) by 0 days.

(21) Appl. No.: 09/453,703

(22) Filed: Dec. 3, 1999

(51) Int. Cl.⁷ .................................................. H04J 3/00
(52) U.S. Cl. .......................... 370/476; 370/477; 370/389
(58) Field of Search ............................... 370/389, 395.1, 370/395.21, 395.52, 395.6, 395.64, 443, 444, 463, 476, 465–467, 493–495, 477

(56) References Cited

U.S. PATENT DOCUMENTS

| | | | |
|---|---|---|---|
| 4,398,290 A | 8/1983 | Mathieu et al. | |
| 4,447,902 A | 5/1984 | Wilkinson | |
| 4,507,782 A | 3/1985 | Kunimasa et al. | |
| 4,599,722 A | 7/1986 | Mortimer | |
| 4,769,818 A | 9/1988 | Mortimer | |
| 4,805,208 A | 2/1989 | Schwartz | |
| 4,888,767 A | 12/1989 | Furuya et al. | |
| 5,057,917 A * | 10/1991 | Shalkauser et al. | 375/240.12 |
| 5,432,787 A | 7/1995 | Chethik | |
| 5,526,353 A | 6/1996 | Henley et al. | |
| 5,546,395 A | 8/1996 | Sharma et al. | |
| 5,553,063 A | 9/1996 | Dickson | |
| 5,586,119 A | 12/1996 | Scribano et al. | |
| 5,592,586 A | 1/1997 | Maitra et al. | |
| 5,602,831 A | 2/1997 | Gaskill | |
| 5,617,423 A | 4/1997 | Li et al. | |
| 5,673,265 A | 9/1997 | Gupta et al. | |
| 5,710,756 A | 1/1998 | Pasternak et al. | |
| 5,793,382 A | 8/1998 | Yerazunis et al. | |
| 5,825,830 A * | 10/1998 | Kopf | 375/340 |
| 5,870,412 A | 2/1999 | Schuster et al. | |
| 5,883,891 A | 3/1999 | Williams et al. | |
| 6,178,405 B1 * | 1/2001 | Ouyang et al. | 704/500 |
| 6,377,573 B1 * | 4/2002 | Shaffer et al. | 370/356 |

* cited by examiner

Primary Examiner—Hassan Kizou
Assistant Examiner—David Odland
(74) Attorney, Agent, or Firm—McGuireWoods, LLP (57) ABSTRACT

A system and method for compressing and transferring analog data in a packet-based computer network in which the times for packets to travel to the destination may vary. The analog signal is sampled at the source to produce a digital data stream. The digitized samples for repetitious sections of the signal are compressed into bytes. Repetitious sections are sections of the signal that are rising, falling, or level. Bytes of compressed data consist of a sign bit for direction of the signal, the amount of change from one signal segment to the next, and the number of samples in a segment. Sampling for the packets overlaps so that each packets contains a certain amount of redundant data. Also, predictive data is appended to each packet. Thus, if a packet is late or lost, the redundant and predictive data in adjacent packets enable the receiver to play back smooth, uninterrupted audio.

26 Claims, 11 Drawing Sheets

Compression Table

| Bit Conversion | Lower Value | Average Value | Higher Value |
|---|---|---|---|
| 000 | 0 | 1 | 1 |
| 001 | 2 | 3 | 4 |
| 010 | 5 | 6 | 7 |
| 011 | 8 | 10 | 12 |
| 100 | 13 | 15 | 17 |
| 101 | 18 | 21 | 24 |
| 110 | 25 | 28 | 31 |
| 111 | 32 | 36 | 40 |

FIG. 1

| Bit Conversion | Lower Value | Average Value | Higher Value |
|---|---|---|---|
| 000 | 0 | 1 | 1 |
| 001 | 1 | 2 | 2 |
| 010 | 2 | 3 | 5 |
| 011 | 4 | 6 | 10 |
| 100 | 8 | 12 | 20 |
| 101 | 12 | 22 | 34 |
| 110 | 14 | 35 | 49 |
| 111 | 16 | 50 | 64 |

FIG. 2

| Bit Conversion | Lower Value | Average Value | Higher Value |
|---|---|---|---|
| 000 | 0 | 1 | 1 |
| 001 | 1 | 2 | 2 |
| 010 | 2 | 3 | 4 |
| 011 | 4 | 6 | 16 |
| 100 | 8 | 12 | 20 |
| 101 | 12 | 22 | 24 |
| 110 | 14 | 21 | 28 |
| 111 | 16 | 24 | 32 |

FIG. 3

| Byte | Contents | No. of Bytes |
|---|---|---|
| 0 – 15 | IP Header | 16 |
| 16 | Normalization No. (uncompressed) | 1 |
| 17 – 79 | Compressed Data | 63 |
| 80 | Normalization No. (uncompressed) | 1 |
| 81 – 143 | Compressed Data | 63 |
| 144 | Normalization No. (uncompressed) | 1 |
| 145 – 207 | Compressed Data | 63 |
| 208 | Normalization No. (uncompressed) | 1 |
| 209 – 271 | Compressed Data | 63 |
| 272 | Normalization No. (uncompressed) | 1 |
| 273 – 335 | Compressed Data | 63 |
| 336 | Normalization No. (uncompressed) | 1 |
| 337 – 399 | Compressed Data | 63 |
| 400 | Normalization No. (uncompressed) | 1 |
| 401 – 463 | Compressed Data | 63 |
| 464 | Normalization No. (uncompressed) | 1 |
| 465 – 527 | Compressed Data | 63 |
| 528 – 575 | Predictive Data (uncompressed) | 48 |
|  |  | 576 |

| Sample # | Sample Value | Change in Sample Values | Byte A BBB CCCC | Hex |
|---|---|---|---|---|
| 1 | 128 | | | |
| 2 | 128 | 0 | | |
| 3 | 128 | 0 | 0 000 0010 | 02 |
| 4 | 121 | -7 | 0 010 0000 | 20 |
| 5 | 122 | +1 | | |
| 6 | 121 | -1 | | |
| 7 | 122 | +1 | | |
| 8 | 122 | 0 | | |
| 9 | 121 | -1 | 0 000 0100 | 04 |
| 10 | 128 | +7 | | |
| 11 | 131 | +3 | | |
| 12 | 132 | +1 | | |
| 13 | 135 | +3 | 1 100 0011 | C3 |
| 14 | 126 | -9 | | |

FIG. 8

DIGITAL AUDIO TELEPHONY OVER IP NETWORK COMPRESSION

BACKGROUND OF THE INVENTION

The present invention pertains to data communications systems, but more specifically to a data compression method for use in transmitting and receiving digitized data such as audio data in a packet-based computer network to compensate for packet loss or variable packet transmission times.

In a packet-based network, such as the Internet, information to be transmitted is broken down into a sequence of bits that are grouped together (usually as a number of 8-bit bytes) into "packets." The packets are transferred from source to destination through switching stations along the best route available. The packet also includes a header that contains an identification number and source and destination addresses. Each packet may travel along a different path and arrive at the destination at different times or out of sequence, but the receiving computer is able to reassemble the original message according to the identification number. Packet switching can result in optimal use of network capacity.

The protocol used to govern the breakup of data messages into packets and manage transmission of the packets through the Internet is Transmission Control Protocol/Internet Protocol ("TCP/IP"). TCP/IP provides for confirmation of successful transmission of packets. The receiving end acknowledges receipt of packets and requests the sending end to retransmit any lost packets, which can result in loss of throughput.

The packets traveling through the network are subject to transmission and processing delay or latency. Transmission delay is the time required for a packet to travel from source to destination, which is determined by the speed of the media and size of the packet. Processing delay is the time required for a network device to perform switching tasks such as route determination and header changes. Variable latency (i.e., variable packet transmission times) can cause "jitter," which is especially disruptive to audio communications. Jitter results when the destination does not receive packets one right after another in smooth succession, but, instead, receives packets at variable times. Audio signals are sensitive to accumulated delay or latency. If the data stream is interrupted or delayed, the reconstructed audio can sound halting or contain gaps while the receiver waits for data to continue the playback. If packets are significantly late or lost altogether, then there may even be periods of no sound in the voice played back. Packets may be lost from occurrences such as receiver buffer overflows, switch contentions, or noise.

TCP/IP introduces delay in packet transmission by confirming successful transmission and requesting retransmission of lost packets. While this delay may not be a significant problem when transmitting pure data signals (e.g., e-mail messages), the delay can unacceptably disrupt the transmission of real-time voice signals. The repercussion from latency and jitter is that packet-based networks and transport protocols that are sufficient for transmitting pure data signals are insufficient for transmission of time-sensitive audio data.

Therefore, a need exists in a packet-based network for compensating for variable packet transmission times, without using additional signal bandwidth or losing throughput, thereby providing smooth, uninterrupted transmission of audio data.

SUMMARY OF THE INVENTION

A general objective of the present invention is to provide a data compression technique for compressing analog data.

A more specific objective of the present invention, in view of the latency inherent in transmission of data in packet-based networks, is to provide a digital data compression method particularly adapted for use with Internet transmission protocols, wherein the compression method samples and digitizes analog signals during the transmission of analog information.

A further objective of the present invention is to compensate for jitter in a computer network, providing seamless, uninterrupted analog information to the destination, by providing a more reliable system for transferring real-time analog data across an unreliable network, such as the Internet.

The present invention provides such a system and method for compressing and transferring analog data in a packet-based computer network in which the times for packets to travel to the destination may vary. The present invention uses compression to lower network usage, as well as redundant and predictive data to compensate for network congestion and latency.

The present invention is implemented in computer software. No particular type of hardware is required other than the hardware used in standard computer networking and analog data capture methods. Those of skill in the art will recognize that while the system and method of the present invention may be embodied in computer software, alternative embodiments may include discrete circuitry (such as packet assembly and disassembly circuits) and microprocessor-based integrated circuits. Those skilled in the art can readily implement the present invention given the following description, diagrams, and flowchart of FIG. 6.

Packets of data containing the source analog information are sent from the sending end or source node to the receiving end or destination node. At the source, an analog-to-digital converter samples the analog signal at a rate of 11,025 samples per second, and converts the samples into 8-bit binary bytes representing, for example, volume levels when the source signal is an audio signal. The samples are collected for a period of around 250 ms to produce the primary data that is compressed into a series of 8-bit bytes and then played back at the receiving end. The primary data samples are divided into a series of segments corresponding to the direction in which the analog signal moves.

The compression method has two aspects. First, the digital information is compressed into a smaller form and placed in bytes that are assembled into packets that do not exceed a certain number of bytes. The compression algorithm uses a look-up table containing binary representations for specific amounts of change between successive sample segments. The second aspect involves time. The digital information to be compressed is collected for a limited amount of time (around 250 ms), and packets are transmitted within a certain amount of time (around every 200 ms) to reduce delay from sender to receiver.

The compressed primary data represents the actual data and the envelope the data follow. A data envelope is a "snapshot" of the data in time, having one of three possible directions—up (rising), down (falling), and straight or level. After the primary data is collected, secondary or predictive data are collected for an additional 150 ms. The secondary data are played back only if the next packet is very late or lost. The predictive data are formed from 48 snapshots of actual data samples taken at even intervals over the 150 ms period. These snapshots are interpolated to form 48 uncompressed 8-bit bytes.

The data are formatted into packets and transmitted on a network such as the Internet. A packet is formed by appending the predictive data to the primary data and adding an IP header to the front of the packet. As each packet is formed, it is immediately transmitted to the receiving end rather than being buffered, which reduces latency. Sampling begins for the second packet approximately 200 ms after sampling begins for the first packet, resulting in 50 ms of overlapping primary data between any two adjacent packets. Following the first packet, the second and succeeding packets are transmitted approximately every 200 ms, or about 5 packets every second.

Upon reaching the destination, the packets are decompressed and reconverted to an analog signal using digital-to-analog converters. The signal is played back to the user in real time, generally following the envelope of the source analog signal to produce a representation of the original analog signal that is very close to the original signal. Compression and decompression and packetization of the data are accomplished quickly and efficiently to ensure real-time processing without loss of information. If a packet is lost or late, the redundant data and secondary data in adjacent packets enable the receiver to play back smooth, uninterrupted data.

BRIEF DESCRIPTION OF THE DRAWINGS

These and other features, aspects, and advantages of the present invention will become better understood upon review of the following description and accompanying drawings, in which.

DETAILED DESCRIPTION OF THE PREFERRED EMBODIMENT

The invention summarized above and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular example set out below is the preferred specific implementation of the present invention. Those skilled in the art should appreciate that they may readily use the conception and specific embodiment disclosed as a basis for modifying or designing other methods and systems for carrying out the same purposes of the present invention. Those skilled in the art should also realize that such equivalent assemblies do not depart from the spirit and scope of the invention in its broadest form.

The present invention provides an improved system for communicating substantially real-time analog signals through an unreliable digital transmission channel. While the invention may facilitate transmission of analog audio, video, and data signals over any packet-based network, the preferred embodiment of the invention is for transmission of digitized audio signals, such as voice signals, over the Internet. In accordance with the preferred implementation of the present invention, the compression algorithm uses a look-up table of changes between segments of repeating data (i.e., a series of samples that continually rise in value, fall, or remain steady) to determine compression. In addition, the invention uses overlapping data between any two adjacent data packets to compensate for lost or late packets.

Data Collection

The signal (10 KHz) is sampled at the source preferably at a rate of 11,025 samples per second with 8 bits per sample. The compression method of the present invention is applicable to other sampling rates by "scaling" the compression table. Scaling refers to the number of packets transmitted per second. For example, if about 4 to 5 packets, each packet containing 576 bytes, are transmitted per second for a sampling rate of 11,025 samples per second, then about 8 to 10 packets are transmitted per second for a sampling rate of 22,050 samples per second. However, the compression table preferably does not change. The samples are collected for a period of around 250 ms to produce the primary data that will be compressed and played back at the receiving end.

After about 512 bytes of primary data have been generated, or after the signal has been sampled and compressed for about 250 ms, whichever occurs first, secondary or predictive data is collected for around an additional 150 ms. Thus, the maximum amount of time permitted for data collection for each packet is about 400 ms. The predictive data compensate for the loss or substantial latency of the next packet transmitted.

In the preferred embodiment, the predictive data is a collection of about 48 snapshots of the signal taken at even intervals through the 150 ms-period. Every two adjacent snapshots are interpolated to produce a mean average between two points. Each average is represented as an 8-bit uncompressed byte, for a total of 48 bytes.

Data Compression

Compression of the data is accomplished using repetitions in the data and the compression look-up table. The compression algorithm uses repetitions in the data stream to reduce the number of sample points that must be included in the packets. In addition, the compression algorithm looks up amounts of change between segments of samples in the compression table, which is optimized to preserve the general shape of the sound envelope of the data stream in the preferred embodiment.

Compression is based upon changes in samples relative to one another. Amounts of change in successive sample segments are embodied in the compression table, and the changes are represented by three-bit binary numbers for a total of 8 different representations ("000" to "111"), as demonstrated in the preferred embodiment of the compression table in FIG. 1. For example, if the last sample of segment 1 is 117 and the last sample of segment 2 is 128, the amount of change between the segments (i.e., 128−117=11) is found on the fourth row of the table in FIG. 1 and is represented as "011." At the receiver, the decompression method would see "011" and represent the amount of change with the middle value of the row, which is 10, resulting in a loss of one volume level from the original data. However, the human ear probably cannot detect this loss of only one level of volume.

Figure 1:
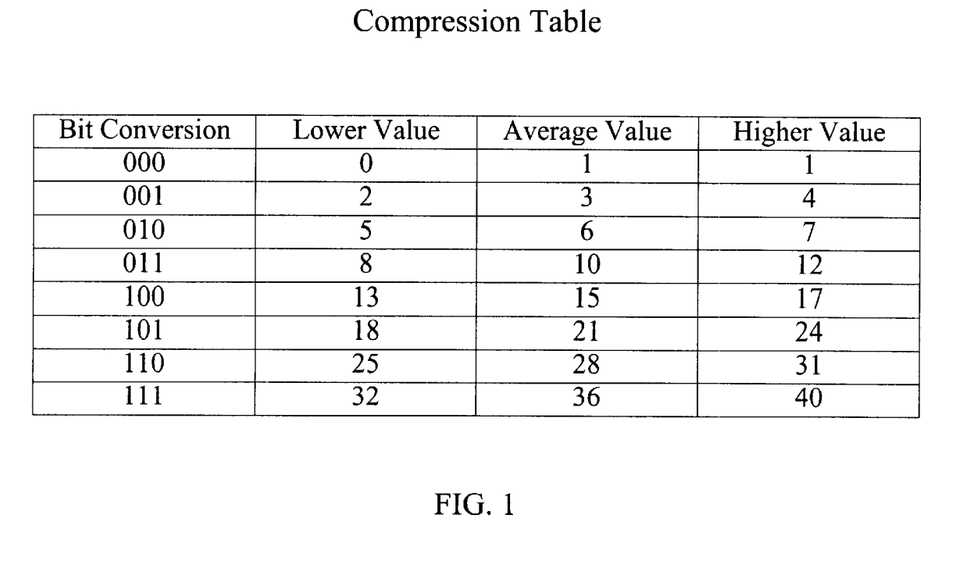
FIG. 1 is a compression table in accordance with the present invention.

The amount of change between the first and second and the second and third numbers on each row is the same (except for the first row, which represents negligible change), and the magnitude of the change increases from the top to the bottom of the table. For example, the amount of change between the numbers on the third row of the table {5 6 7} is 1, while the amount of change between the numbers on the eighth row {32 36 40} is 4. The amount of change between the numbers in a row is greater toward the bottom of the table because large changes in volume occurring between adjacent samples for voice signals over an interval of a fraction of a millisecond are rare.

Figure 2:
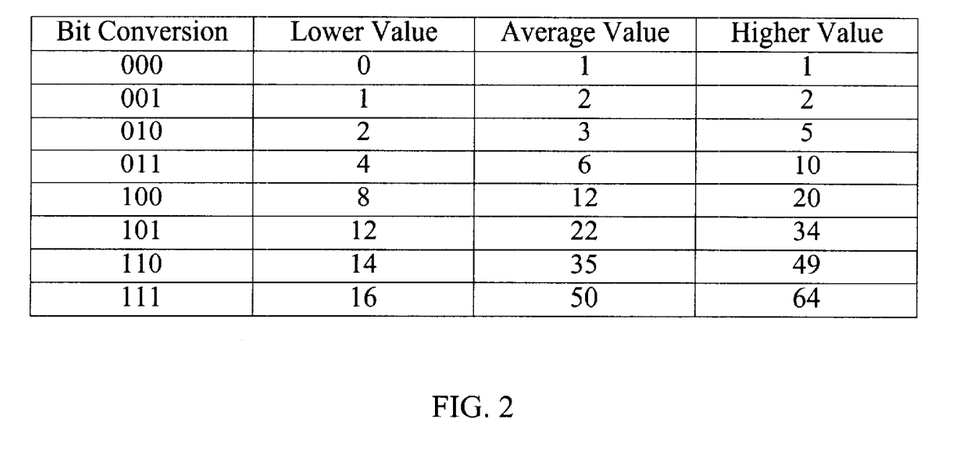
FIG. 2 is an example of a compression table using a sampling rate of 16,000 samples per second.
Figure 3:
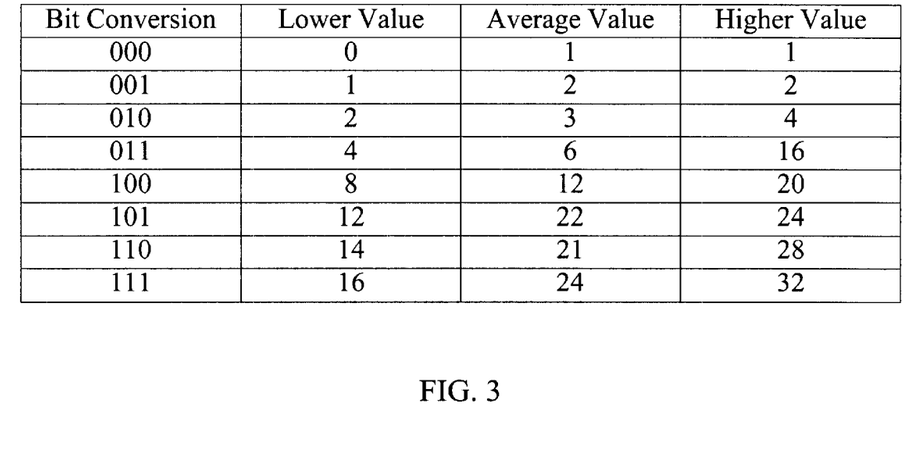
FIG. 3 is an example of a compression table using a sampling rate of 10,000 samples per second.

Referring to FIG. 1, the preferred compression table allows for a maximum change in volume level between successive samples of 40. The maximum change of 40 provides the optimal amount of change between sample segments on the rows of the compression table, resulting in adherence to the original sound envelope with a minimal amount of distortion. However, other variations are possible for the compression table. For example, FIG. 2 shows a possible compression table using a sampling rate of 16,000 samples per second, and FIG. 3 shows a possible compression table using 10,000 samples per second. The examples in FIGS. 2 and 3 contain rows with overlapping values. For example, in FIG. 2, the row for "011" contains {4 6 10}, while the row for "100" contains {8 12 20}. If the amount of change between two sample segments is 9, then the row selected is based upon trending. If previous samples displayed a fast upward trend, then row "100" is selected. Otherwise, row "011" is selected. The maximum change of 64 in FIG. 2 produced more distortion than that of the preferred embodiment because the greater the amount of change between the numbers in each row, the greater the loss in resolution. The maximum change of 32 in FIG. 3 did not provide a sufficient representation for changes in volume.

Human speech inherently contains many repeating segments in voice patterns. Only the changes in the signal from one segment to the next need to be transmitted. Repetitions include samples in a particular segment of the signal that have the same value or a negligible amount of change between the samples (i.e., the amount of change is zero or ±1). In addition, repetitions include samples in a segment where all the samples are steadily rising or falling in value.

The samples are analyzed to determine whether the corresponding segment of the analog signal is moving up, down, or staying the same. If the samples in a particular segment stay the same in value or change by only a negligible amount (i.e., change by ±1), then according to the first row of the compression table in FIG. 1, the amount the samples change within the segment, also referred to as differential of change ("DOC"), is represented as "000" and the samples are considered to be redundant. The human ear usually cannot detect changes in volume of a negligible amount. Noise can cause negligible amounts of fluctuation in the signal. Thus, the signal is rarely perfectly steady. A series of these minute fluctuations in signal volume are treated as redundant.

A total of 16 samples or repetitions are permitted within one segment, ranging from the binary bit sequences "0000" to "1111." In other words, one segment may contain, at the most, 16 samples that are all the same in value or vary by ±1, 16 samples that all steadily rise in value, or 16 samples that all steadily fall in value. A byte is formed if a segment contains 16 repetitions. A second byte is formed for repetitions in excess of 16. A maximum of 16 repetitions provides a maximum allowable compression ratio of 16:1, reducing the number of samples per second from 11,025 to 689.

A byte is formed whenever the compression algorithm (1) counts 16 repetitions, or (2) detects a change in signal direction (e.g., the signal was falling then becomes level) and the change is not negligible. The byte structure for each compressed byte can be represented as ABBBCCCC, where A represents the sign bit, BBB represents the DOC for the segment, and CCCC represents the number of repetitions in a segment. The sign bit (A) represents the direction of the analog signal –"1" represents a rising signal and "0" represents a falling signal. The sign bit will also be "0" for a segment in which the signal is steady or level. The DOC (BBB) is obtained from the compression table in FIG. 1 and ranges from "000" to "111." The number of repetitions (CCCC) is the actual number of samples in the segment minus 1, and ranges from "0000" to "1111."

A byte is also formed when the DOC is greater than 40, with a repetition value of "0001." The starting reference value for the next byte will be 40 greater than the last sample value. For example, if the value of sample 1 is 100 and the value of sample 2 is 145, the starting reference value for the next segment of samples will be 140. However, a DOC greater than 40 is not likely because audio sound patterns do not normally change so much in less than 1 ms.

Packet Assembly

Figure 4:
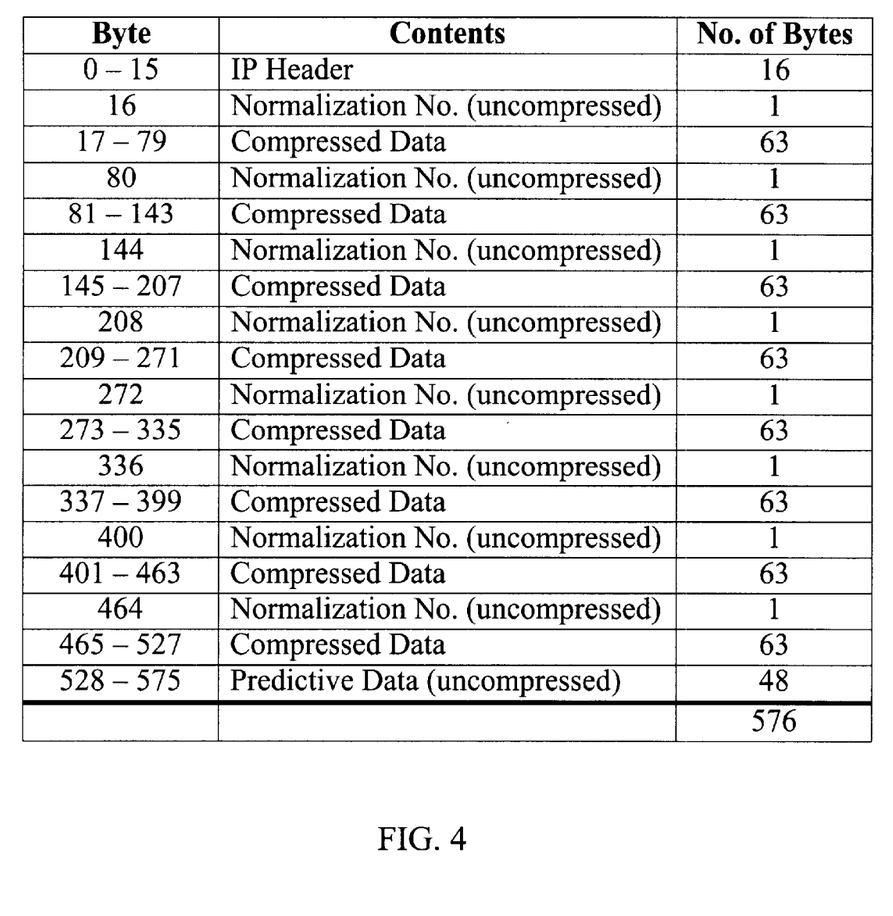
FIG. 4 illustrates a particular byte structure for a packet according to the present invention.

A packet is formed by appending the predictive data bytes to the compressed primary data bytes and adding an IP header to the beginning of the packet. FIG. 4 displays one possible packet byte structure for the present invention. Because the size of the IP header can vary, the actual byte locations in the packet can change. However, changes to the number of IP header bytes do not affect the actual reference point zero in the data, which is always byte 0 because the IP header is stripped away by the network protocols. Referring to the embodiment of the packet byte structure in FIG. 4, the IP header occupies up to the first 16 bytes of the packet (i.e., bytes 0 to 15).

In the preferred embodiment, the first byte following the IP header (byte 16), and every 64th byte thereafter, contains a normalization number. The normalization number represents the actual sample value and thus is not compressed. Rather, the raw data is encoded as an 8-bit binary number. For example, a normalization number of 135 would be encoded as "10000111."

The normalization number is used for normalization or adjustment purposes to maintain the integrity of the DOC and prevent drifting of the sound pattern, as well as center the volume integrity of the sound pattern so that a zero reference is maintained. The 64-byte chunk composed of the normalization number followed by 63 bytes of compressed primary data is repeated up to eight times to yield a preferable maximum size for primary data of 512 bytes, unless 250 ms of sampling and compression is reached first. Then the block of primary data will contain fewer than 512 bytes.

The preferred maximum size for a packet is 576 bytes (bytes 0 to 575), which is the smallest maximum transmittable unit ("MTU") for a majority of routers currently used on the Internet. Various routers, which receive and forward messages over the most efficient available route, use different maximum packet sizes. The MTU sets the maximum size for a packet before the router will split the packet into multiple smaller packets.

For example, if a large packet, say 2,000 bytes in length, passes through a router with a MTU of 576, the router will divide the packet into four fragmented packets, increasing the possibility by a factor of four of losing the original data. If one fragmented packet is lost, then the entire original packet is lost and must be retransmitted, increasing latency and adversely affecting the sound the recipient hears. Limiting the maximum size of a packet in the present invention to 576 bytes helps ensure the packets are not split apart by the routers, and thus is the preferred maximum packet size for traversing the Internet with minimal packet loss, especially in congested network segments.

Form Second Packet

Figure 5:
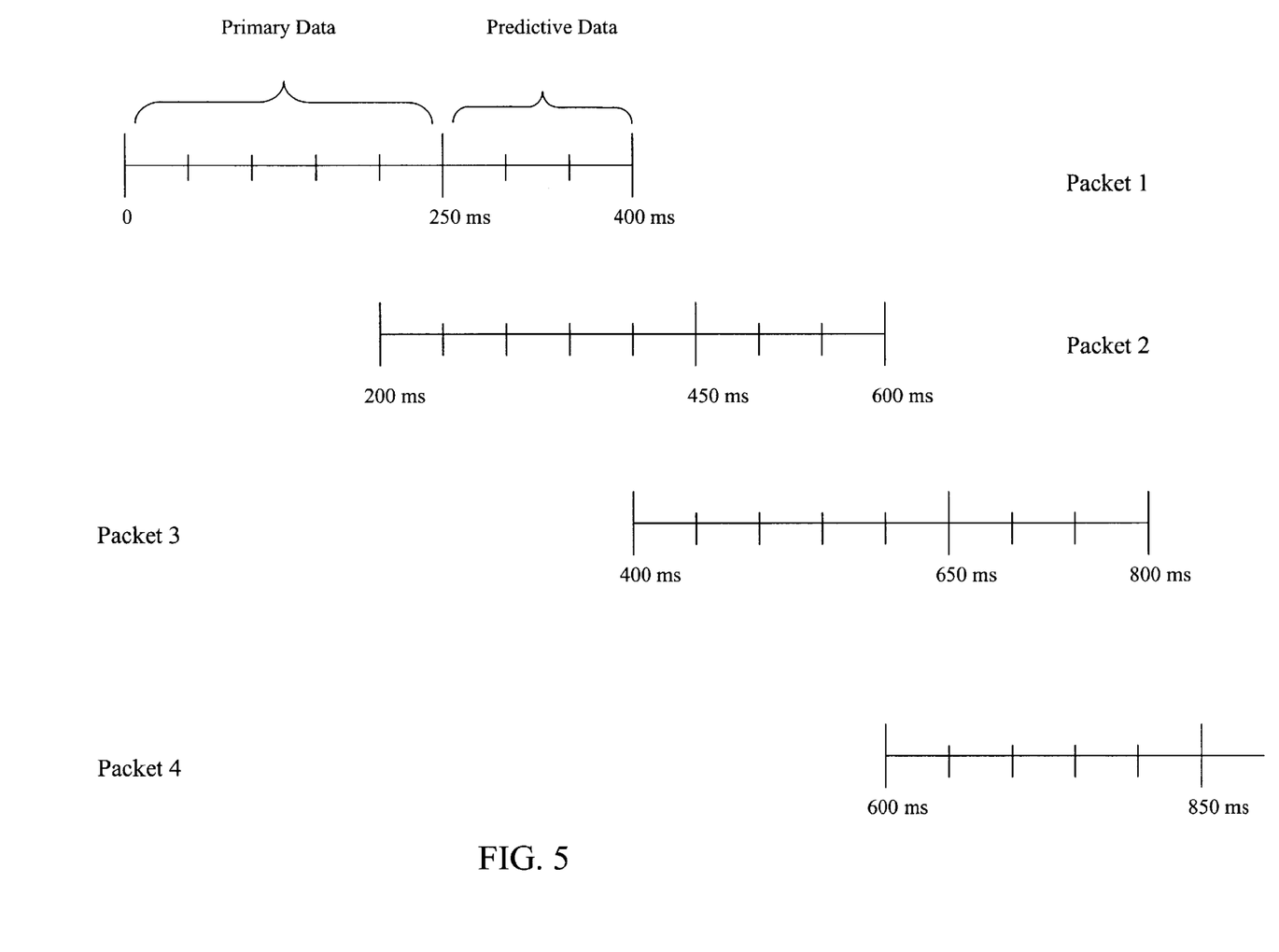
FIG. 5 illustrates a timing diagram for the collection of data and transmission of packets according to the present invention.
Figure 6A:
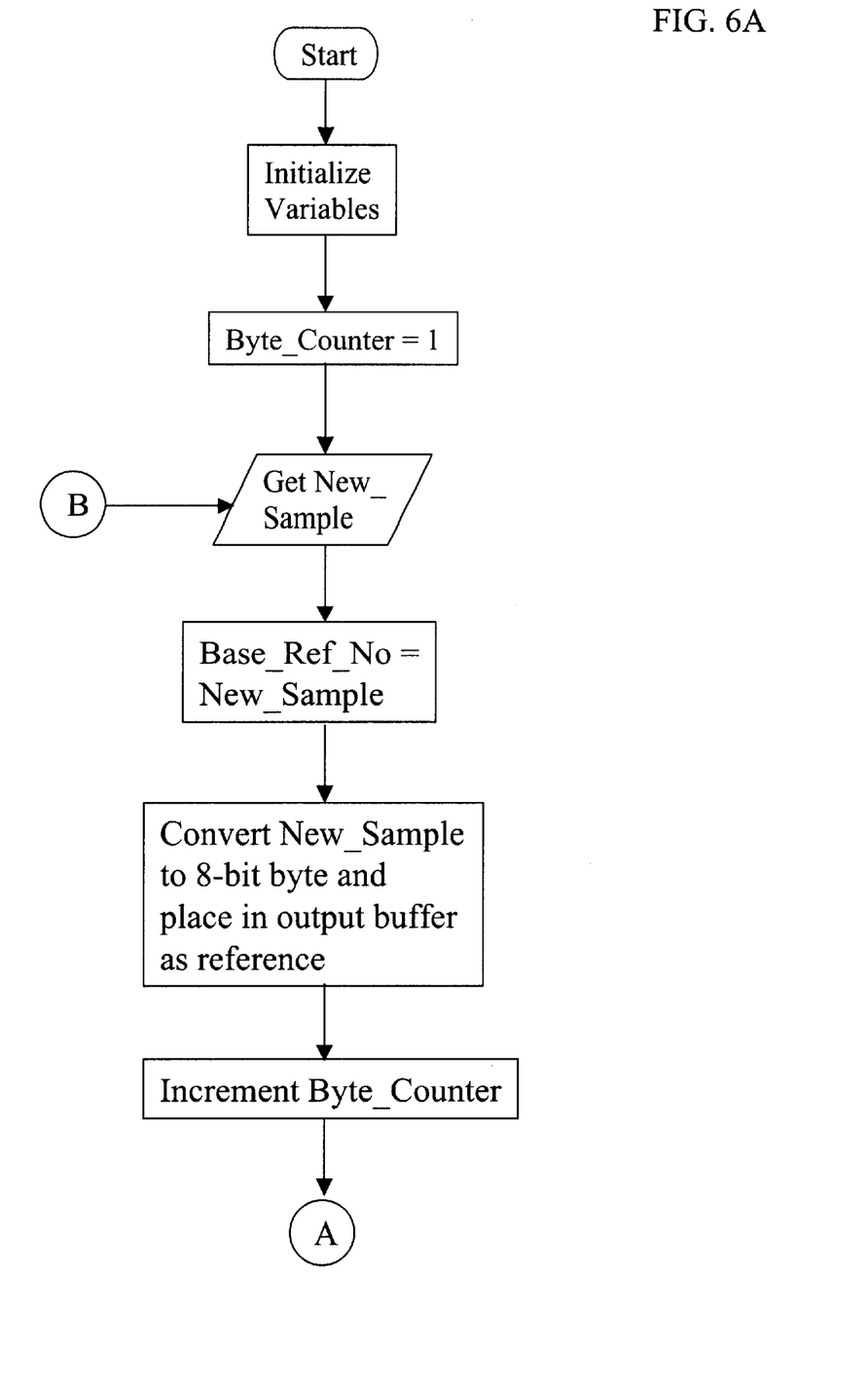
FIG. 6 is a flowchart illustrating the steps for compressing data and forming packets in accordance with the present invention.
Figure 6B:
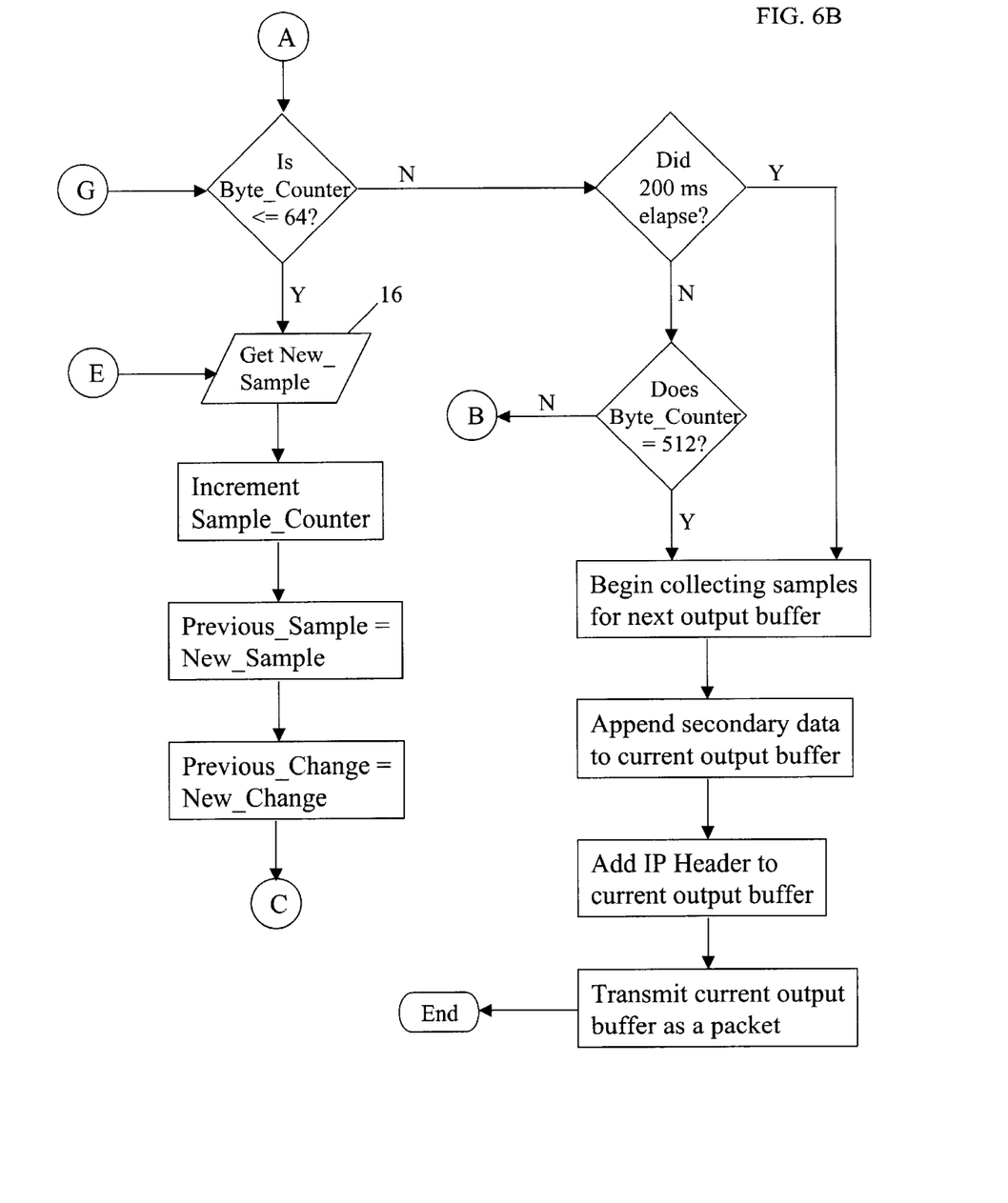
Figure 6C:
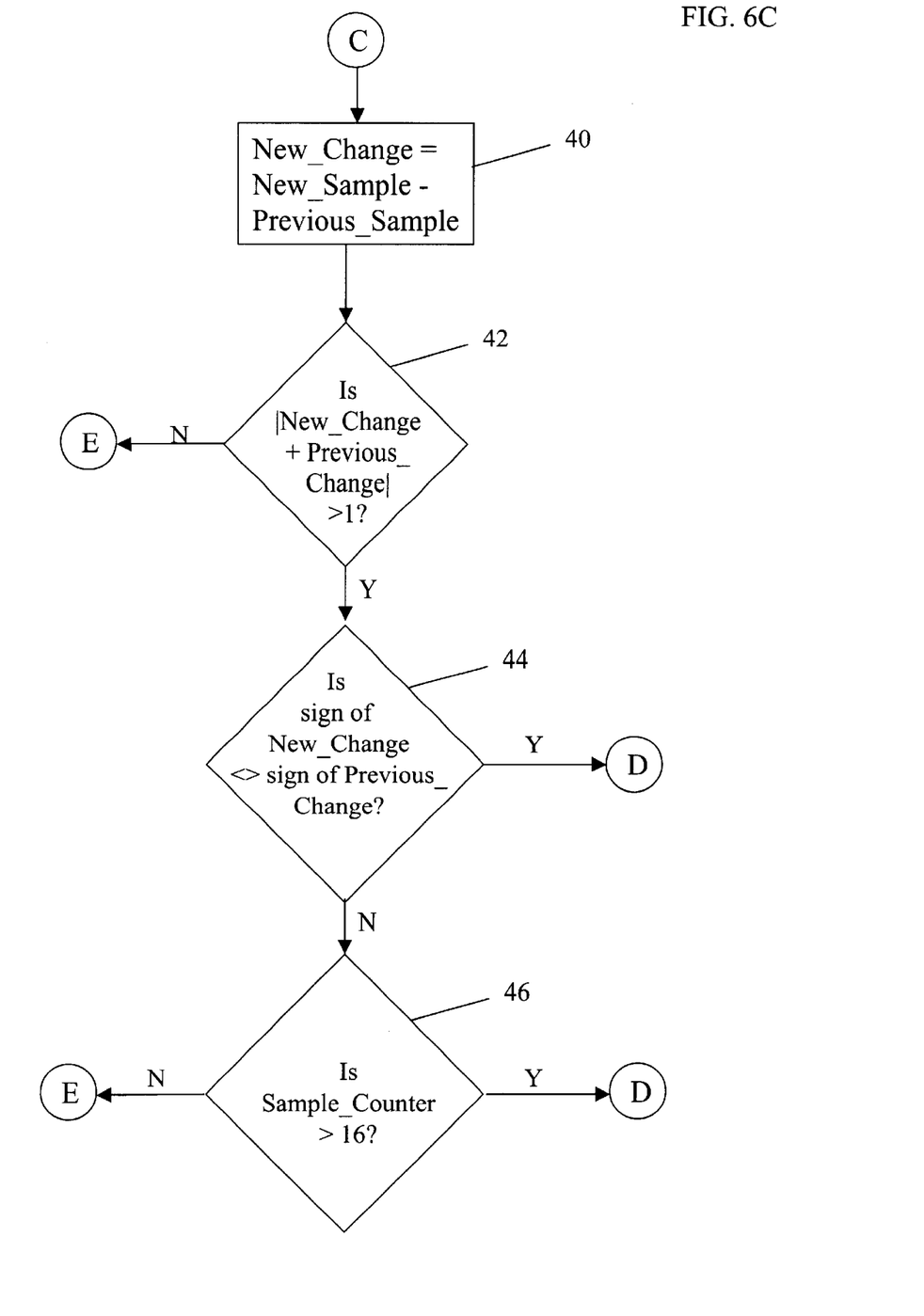
Figure 6D:
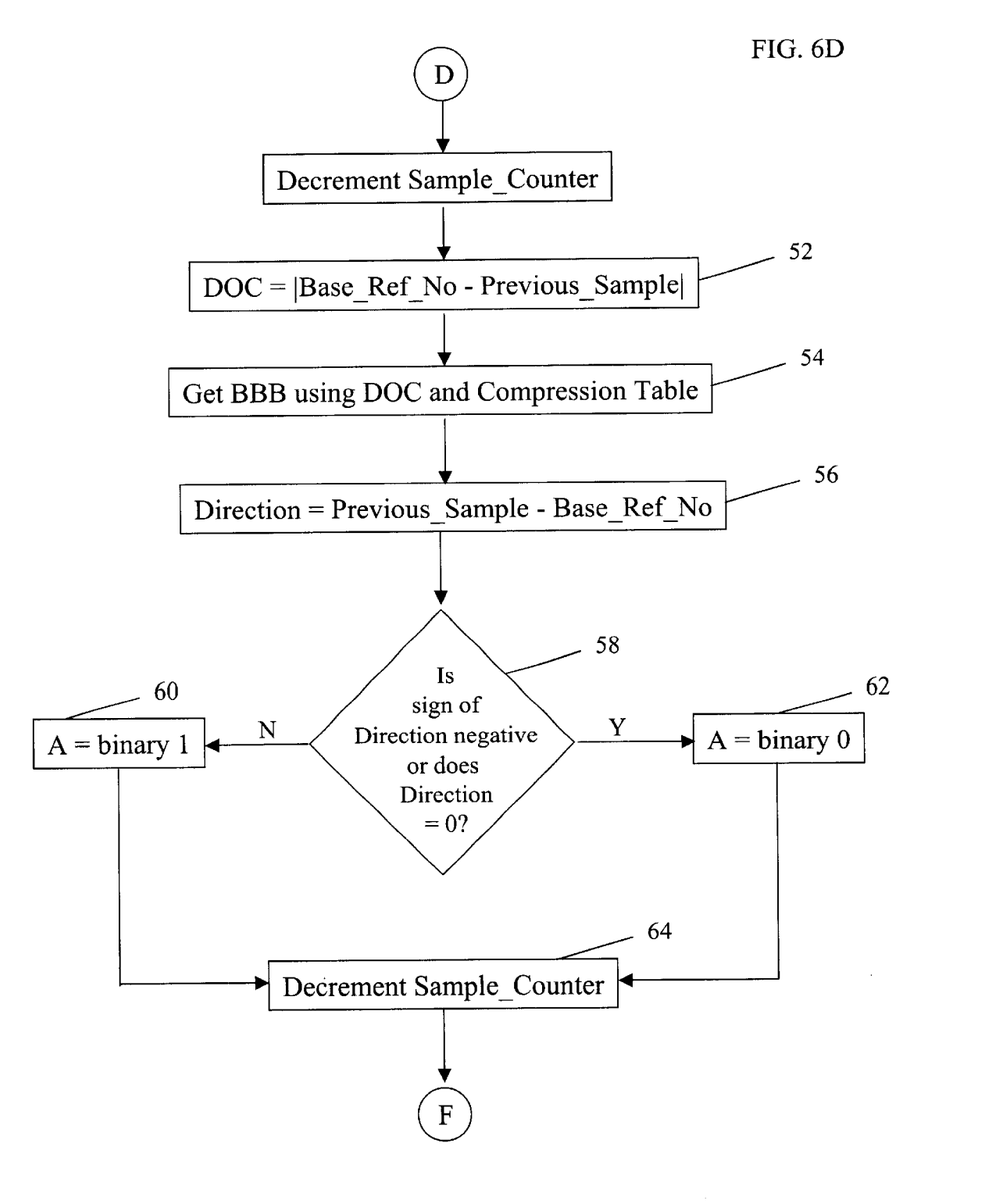
Figure 6E:
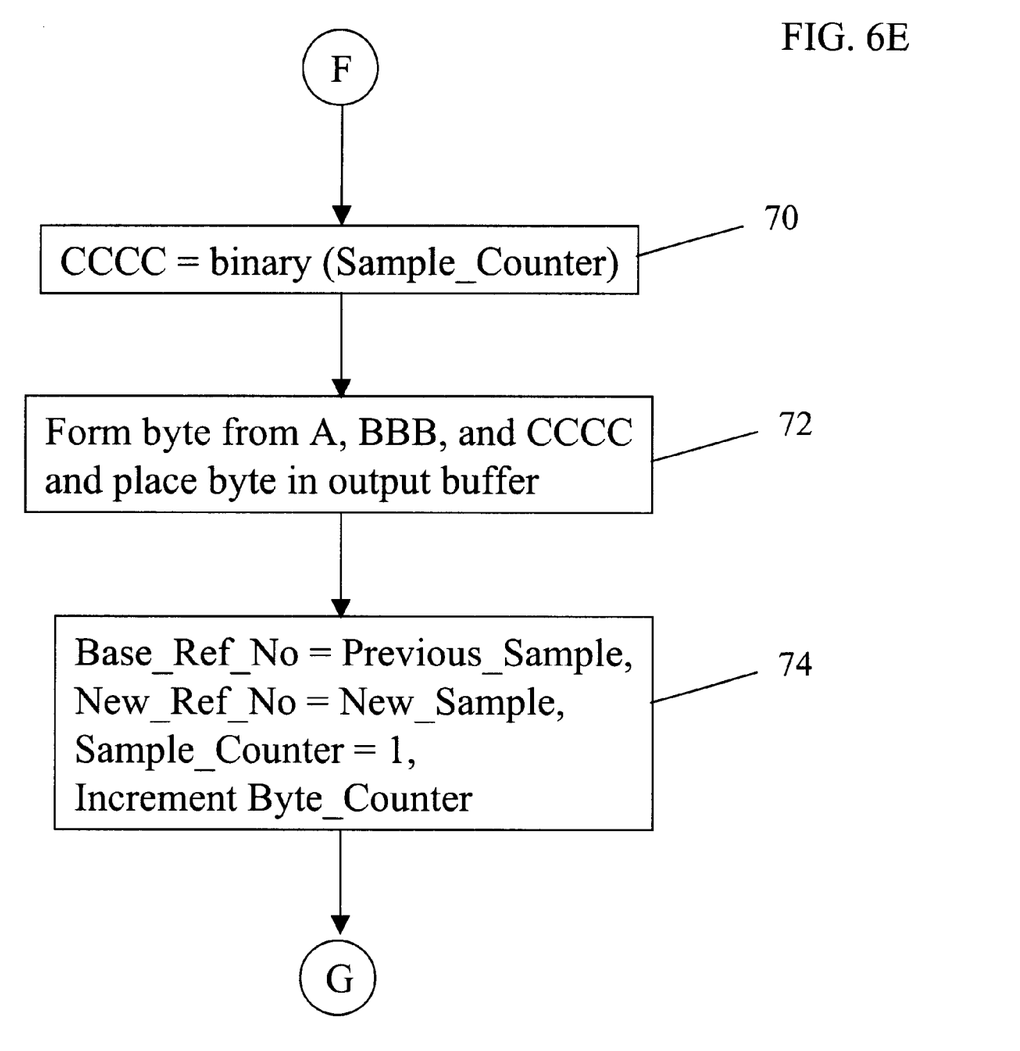

In accordance with the preferred embodiment, after around 200 ms of data are collected for the first packet (i.e., 2,205 samples have been collected), sampling begins for the second packet while sampling for the first packet continues. Sampling begins for a new packet approximately every 200 ms. In addition, following transmission of the initial packet, which occurs after approximately 400 ms from initiation of the audio stream, a new packet is transmitted around every 200 ms. Thus, for a 10 KHz signal, the packets are transmitted at a target rate of 5 packets per second, creating a bandwidth requirement of approximately 2.6 to 3.0 KB/sec. Referring to the timing diagram of FIG. 5, because primary data sampling spans around 250 ms but additional sampling begins for a new packet every 200 ms, each packet will contain a 50 ms replica of the next packet's first 50 ms of primary data.

Packet Transmission

The packets are transferred across the network preferably according to the Internet Protocol ("IP"). IP is commonly used today as the primary method of moving data from one location to another on the Internet, as well as on private networks. IP governs the breakup of data messages into packets, as well as routing the packets through the network and reassembly of the packets at the destination.

Furthermore, formation of packets in the present invention is preferably governed by the User Datagram Protocol ("UDP") as defined by the Internet Engineering Task Force under Request for Comments ("RFC") 1122, subsection 4.1. UDP is a connectionless protocol within TCP/IP that is more efficient than TCP because it does not verify that messages are delivered correctly. Thus, UDP allows for minimal overhead. UDP is used in the present invention because of the time sensitivity of the information to be delivered. The time taken for the receiver to acknowledge receipt of the information may result in unacceptable gaps in time that cause degraded quality of sound or even periods of no audio at all. Thus, packets are not retransmitted in the event of loss in the present invention.

Decompression

The data is decompressed at the receiving end. The packets are broken down into primary and predictive data. Because the IP header bytes have been stripped off, the decompression engine begins analysis of the data at byte 0, which is the first normalization number. The decompression engine analyzes the data byte-by-byte, extracting the DOC, direction of change, and number of repetitions. The decompression engine then recreates the digital data stream as a series of numbers representing volume levels for each byte, using the extracted information. The data stream is sent to a digital-to-analog processor where the stream is converted to audible sound.

In the preferred embodiment, the first byte, which is the first normalization number, will determine the initial volume level or starting point. For successive bytes, the number of repetitions will determine the number of recreated data points for that byte. For example, if the number of repetitions CCCC is "0100," then 4+1=5 numbers will be generated for that byte. The last number generated for the byte becomes the base reference number for the next byte. The sign bit, used in conjunction with the DOC, will determine whether the numbers are rising, falling, or level. Finally, the DOC is added to or subtracted from, depending on the direction of change, the base reference number. For example, if the previous byte yielded the numbers 120, 121, and 122, with a resulting base reference number of 122, and (1) the DOC for the current byte is "010" or 6 from the compression table of FIG. 1, (2) the direction of change is "1," and (3) the number of repetitions is "0011" (i.e., 3+1=4), then the fourth number generated for the current byte becomes 128 (122+6=128). Three numbers will lie between the base reference number (122) and the last number generated for the current byte (128). In this manner, the general shape of the sound envelope of the signal is recreated.

Considering two data packets in sequence, assuming neither packet is late or lost, the audio from the first or current packet is played back for 200 ms. At this point, the audio from the first packet is no longer played back, but the audio from the second or next packet begins playing, starting with byte 0 of the second packet. The overlapping audio in the two packets cannot play back at the same time because doing so would result in the recipient hearing an echo.

If the second packet is late (meaning the second packet is received later than about 200 ms after the first packet is received but before about 400 ms after the first packet is received), the receiver will determine the location in the second packet to begin playing back the audio to allow for a constant flow of audible information from source to destination. The receiver analyzes the amount of time passed and uses an index of bytes processed in the first packet to locate the point in the second packet to begin playback. If the second packet is very late, then the predictive data in the first packet will begin to play back. When the second packet arrives, the receiver will determine the point in the second packet at which to begin playback. The receiver can sustain a latency of about 400 ms before the recipient detects gaps in sound, and a latency of around 300 ms before the recipient notices audio degradation.

If the second packet is lost in transmission (meaning the second packet is either never received or received about 400 ms after the first packet is received), the first packet will be able to compensate for the loss by playing back the 50 ms of redundant primary data for the period between 200 and 250 ms, as well as the 150 ms of predictive data appended to the end of the packet. This allows for a total loss of around 40% of the original data while maintaining a continuous audio stream with minimal audio degradation.

EXAMPLE

The following example illustrates how the compression algorithm of the present invention, which is shown in flowchart form in FIG. 6, may compress a stream of data. A possible stream of data, representing digitized, sampled audio, may include the following: [previous samples]-128-

128-128-121-122-121-122-122-121-128-131-132-135-126-[future samples]

Figure 7:
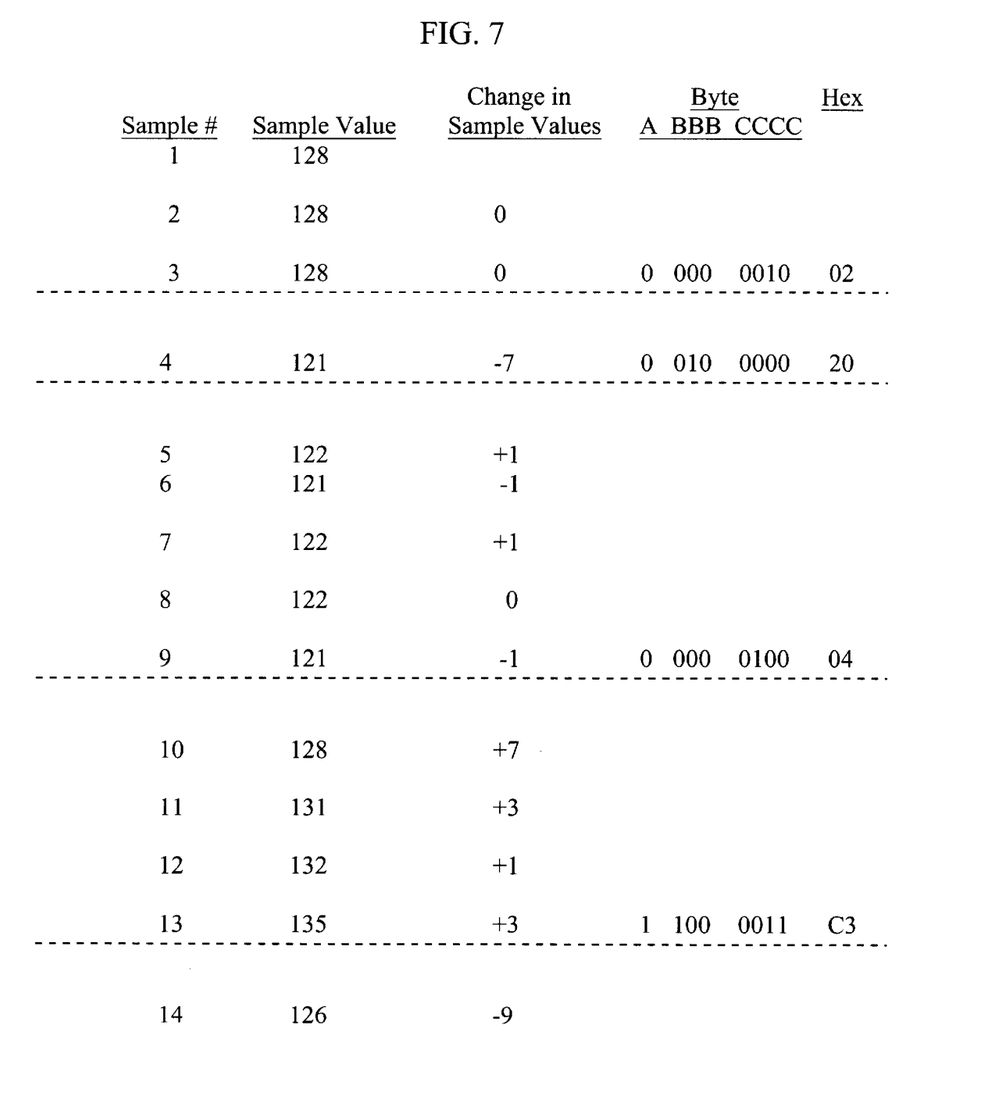
FIG. 7 illustrates data compression for a particular example of the present invention.

The data stream is also shown in FIG. 7. The dashed lines in FIG. 7 indicate where bytes will be formed. In this example, four bytes will be formed from the four segments containing samples 1–3, 4, 5–9, and 10–13. A byte is created whenever the compression algorithm detects 16 repetitions 46, or a change in direction (e.g., the audio signal begins to rise when it was falling) where the change is not negligible 40, 42, 44.

The first three samples are the same with an amount of change of 0 between samples 1 and 2 and between samples 2 and 3. However, the change between sample 3 (128) and sample 4 (121) is −7, which indicates a change in direction (falling). This can more easily be seen graphically in FIG. 8. The circles in FIG. 8 indicate the samples that are contained in the four bytes. Thus, a byte is created for the first three samples. The number of repetitions (CCCC) for this byte is 3 minus 1, or 2, and is represented as ("0010"). There was no change in value between the three samples, so the DOC (BBB) is 0, which is represented by "000" according to the compression table in FIG. 1. Because the first three samples are level (not rising or falling), the sign bit (A), which shows change in direction, does not matter, so it is assigned "0." Thus, following the byte structure for a compressed byte of ABBBCCCC, the first byte becomes "00000010" or "02" in hexadecimal notation.

Sample 3 (128), the last sample in the previous segment of samples forming a byte, becomes the base reference number 74. Sample 4 (121) becomes the new reference point for the next set of samples 74. The amount of change between sample 3 (128) and sample 4 (121) is −7. Continuing with the next sample 16, the amount of change between sample 4 (121) and sample 5 (122) is +1. The change from −7 to +1 indicates a change in direction with a change that is not negligible 40, 42, 44. Thus, another byte will be formed that only includes sample 4 (121). Because the number of samples in this group is 1, the number of repetitions is 1 minus 1, or 0 ("0000") 64, 70. The DOC is the absolute value of the base reference number minus the last sample in the current set of samples 52, or |128 minus 121|=7, which is represented as "010" according to the compression table 54 in FIG. 1. Because sample 4 is falling relative to the first byte formed, as shown in FIG. 8, the sign bit is "0" 56, 58, 62 Thus, the second byte becomes "00100000" or "20" in hexadecimal notation 72.

Sample 4 (121) becomes the base reference number and sample 5 (122) becomes the new reference point for the next set of samples 74. The amount of change 40 between sample 4 (121) and sample 5 (122) is +1. The amount of change 40 between sample 5 (122) and sample 6 (121) is −1. The change from +1 to −1 indicates a change in direction from sample 5 to sample 6. However, changes from +1 to −1, −1 to +1, ±1 to 0, or 0 to ±1 indicate negligible change 42, so a byte is not formed at this point. Likewise, the amounts of change between sample values are negligible up to sample 9. However, the amount of change between sample 9 (121) and sample 10 (128) is +7, indicating a change in direction 40, 42, 44 that is more than 0 or ±1. Thus, the third byte contains samples 5 to 9, and sample 9 (121) becomes the last sample in the current set of samples.

Figure 8:
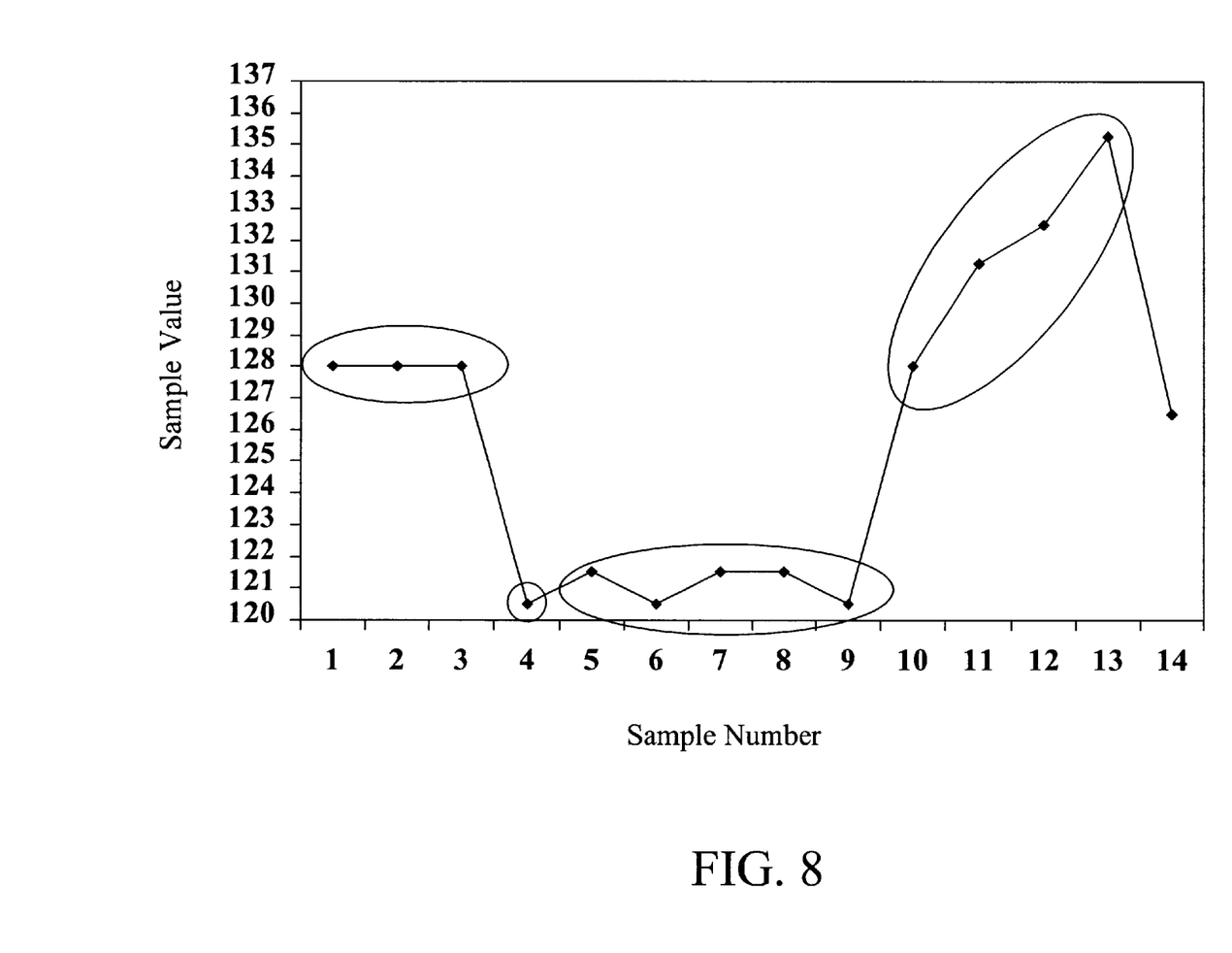
FIG. 8 is a graph of the data stream used in the example of data compression for the present invention.

This can be seen more easily from the graph in FIG. 8. The signal is level for the first three samples, then it begins falling. At sample 4, the signal stops falling and becomes level again. Thus, a third byte is formed that contains samples 5 to 9. The number of samples in this group is 5, so the number of repetitions is 5 minus 1, or 4 ("0100") 64, 70. The DOC 52 for this group is |121 (base reference number) minus 121 (sample 9)|=0, which is represented as "000" according to the compression table 54. As can be seen in the graph in FIG. 8, the samples for this group bounce back and forth between 121 and 122, resulting in change that is negligible. Because the samples in this group are not steadily rising or falling, but remaining approximately level, the sign bit is assigned "0" 56, 58, 62. Thus, the third byte becomes "00000100" or "04" in hexadecimal notation 72.

Sample 9 (121) becomes the base reference number and sample 10 (128) becomes the new reference point for the next set of samples 74. The amount of change 40 between sample 9 (121) and sample 10 (128) is +7 (indicating the audio signal is rising). The amount of change 40 between sample 10 (128) and sample 11 (131) is +3. The change from +7 to +3 indicates the signal is still rising 44, so a byte is not formed at this point. Likewise, the signal continues to rise through sample 13. The amount of change 40 between sample 12 (132) and sample 13 (135) is +3. The amount of change 40 between sample 13 (135) and sample 14 (126) is −9. The change from +3 to −9 indicates the signal begins to fall 42, 44 between samples 13 (135) and 14 (126). Thus a fourth byte is formed that contains samples 10 to 13. The number of samples in this group is 4, so the number of repetitions is 4 minus 1, or 3 ("0011") 64, 70. The signal has continued to rise from the base reference number, sample 9 (121), to the last sample in the current segment, sample 13 (135), so the sign bit is assigned "1" 56, 58, 60. The DOC 52 for the fourth byte is |121 minus 135|=14, which is represented as "100" according to the compression table 54 in FIG. 1. Thus, the fourth byte becomes "11000011" or "C3" in hexadecimal notation 72.

What is claimed is:

1. A method of transmitting a source analog signal over a packet-based computer network from a source node to a destination node, the method comprising the steps of:
   (a) converting the analog signal into a stream of digital data samples;
   (b) collecting the digital data samples into primary data samples and secondary data samples;
   (c) dividing the primary data samples into a series of segments corresponding to the direction in which the analog signal moves;
   (d) compressing each segment, the segment being compressed referred to as a current segment and the segment immediately previously compressed referred to as a previous segment, into an 8-bit byte represented by the bit pattern ABBBCCCC, wherein A is a sign bit representing the direction of movement of the current segment, BBB represents the amount of change between the current segment and the previous segment, and CCCC represents the number of primary data samples within the current segment;
   (e) assembling the primary and secondary data samples into a series of data packets such that every two adjacent data packets contain a portion of redundant data;
   (f) transmitting the data packets over the network serially, such that a first packet is transmitted followed by a second packet and so forth until a last packet is transmitted;
   (g) receiving the transmitted data packets at the destination node; and
   (h) converting the received data packets into a form that is representative of the source analog signal;

whereby the redundant and secondary data are played back at the destination node when a data packet is late or lost to compensate for network congestion and latency.

2. The method of claim 1, wherein the step of collecting the digital data samples includes collecting digital data samples for a period of about 250 ms, the digital data samples collected during this period comprising the primary data samples.

3. The method of claim 2, wherein the step of collecting the digital data samples further includes collecting digital data samples for a period of about an additional 150 ms, the digital data samples collected during this period comprising the secondary data samples.

4. The method of claim 1, wherein the step of compressing each segment further includes determining BBB by looking up the amount of change between the current and previous segments in a compression table and reading the corresponding BBB bit pattern, the compression table including a plurality of entries for the amount of change between the current and previous segments and associated 3-bit representations.

5. The method of claim 1, wherein the step of compressing each segment into an 8-bit byte includes creating the byte after detecting 16 primary data samples within the segment.

6. The method of claim 1, wherein the step of compressing each segment into an 8-bit byte includes creating the byte after detecting a change in the direction in which the analog signal is moving, where the change in direction is not negligible.

7. The method of claim 1, wherein the step of assembling the primary and secondary data samples into data packets comprises:
(a) placing about 512 bytes of the primary data samples into each data packet, wherein the first byte and every 64th byte thereafter is an uncompressed primary data sample for normalization purposes, and the remainder of the about 512 bytes are the compressed primary data samples;
(b) appending the secondary data samples to the end of the primary data samples; and
(c) adding an Internet Protocol (IP) header to the front of the data packet.

8. The method of claim 1, wherein the step of assembling the primary and secondary data samples into data packets includes placing up to about 576 bytes in each data packet.

9. The method of claim 1, wherein the step of assembling the primary and secondary data samples into data packets conforms to the User Datagram Protocol (UDP).

10. The method of claim 1, wherein the step of collecting the digital data samples into primary and secondary data samples further includes collecting the digital data samples for a new data packet about every 200 ms, resulting in about 50 ms of overlapping or redundant primary data between any two adjacent data packets.

11. The method of claim 1, wherein the packet-based network is the Internet and transmission of the data packets conforms to the Internet Protocol (IP).

12. The method claim 1, wherein the step of transmitting the data packets includes transmitting a new data packet about every 200 ms, except for the first data packet created, which is transmitted about 400 ms after sampling begins for the first data packet.

13. The method of claim 1, wherein the step of converting the data packets comprises:
(a) dividing each data packet into the primary and secondary data samples;

(b) decompressing each compressed byte by extracting the segments and the bit patterns A, BBB, and CCCC for each segment, and looking up the bit pattern BBB in the compression table to determine the amount of change between the current and previous segments;
(c) recreating the stream of digital data samples using the direction of change in signal movement (A), the amount of change between current and previous segments (BBB), and the number of data samples in each segment (CCCC), and the secondary data samples;
(d) converting the stream of digital data samples into a destination analog signal; and
(e) playing back the destination analog signal as each data packet is converted, the data packet being played back referred to as the current packet and the data packet that should be received at the destination immediately after the current packet referred to as the next packet.

14. The method of claim 13, wherein the step of playing back the destination analog signal as each data packet is converted comprises:
(a) if the next packet is not received late or lost in transmission, then playing back the primary data samples portion of the current packet for about 200 ms, and then beginning playing back the primary data samples portion starting at the beginning of the next packet;
(b) if the next packet is received late, then playing back the current packet until the next packet is received, which may include playing back a portion of the secondary data depending on how late the next packet is received, determining the location in the next packet at which to begin playing back, and then beginning playing back the next packet at the determined location; and
(c) if the next packet is lost in transmission, then playing back the current packet in its entirety, including the secondary data.

15. A system for transmitting a source analog signal over a packet-based computer network from a source node to a destination node, the system comprising:
(a) means for converting the analog signal into a stream of digital data samples;
(b) means for collecting the digital data samples into primary data samples and secondary data samples;
(c) means for dividing the primary data samples into a series of segments corresponding to the direction in which the analog signal moves, the series of segments having current segments and previous segments;
(d) means for compressing each segment, the segment being compressed referred to as the current segment, into an 8-bit byte represented by the bit pattern ABBBCCCC, wherein A is a sign bit representing the direction of movement of the current segment, BBB represents the amount of change between the current segment and the previous segment, and CCCC represents the number of primary data samples within the current segment;
(e) means for assembling the primary and secondary data samples into a series of data packets such that for any two adjacent data packets, referred to as a first data packet and a second data packet, where the second data packet is assembled immediately after the first data packet, the first and second data packets contain a portion of redundant data;
(f) means for transmitting the data packets serially over the network;

(g) means for receiving the transmitted data packets at the destination node; and (h) means for converting the received data packets into a form that is representative of the source analog signal.

16. The system of claim 15, wherein the means for collecting the digital data samples into primary and secondary data samples includes:

(a) means for collecting digital data samples for a period of about 250 ms, the digital samples collected during this period comprising the primary data samples, and (b) means for collecting digital data samples for a period of about an additional 150 ms, the digital samples collected during this period comprising the secondary data samples.

17. The system of claim 15, wherein the means for compressing each segment includes look-up table means for determining BBB, the look-up table having a plurality of entries for the amount of change between the current and previous segments and associated 3-bit representations.

18. The system of claim 15, wherein the means for compressing each segment into an 8-bit byte includes means for creating the byte after detecting 16 primary data samples within the segment.

19. The system of claim 15, wherein the means for compressing each segment into an 8-bit byte includes means for creating the byte after detecting a change in the direction in which the analog signal is moving, where the change in direction is not negligible.

20. The system of claim 15, wherein the means for assembling the primary and secondary data samples into data packets includes:

(a) means for placing up to about 576 bytes in each data packet;

(b) means for placing about 512 bytes of the primary data samples into each data packet, wherein the first byte and every 64th byte thereafter of the about 512 bytes is an uncompressed primary data sample for normalization purposes, and the remainder of the about 512 bytes are the compressed primary data samples;

(c) means for appending the secondary data samples to the end of the primary data samples; and (d) means for adding an Internet Protocol (IP) header to the front of the data packet.

21. The system of claim 15, wherein the means for assembling the primary and secondary data samples into data packets conforms to the User Datagram Protocol (UDP).

22. The system of claim 15, wherein the means for collecting the digital data samples into primary and secondary data samples includes means for collecting the digital data samples for a new data packet about every 200 ms.

23. The system of claim 15, wherein the packet-based network is the Internet and transmission of the data packets conforms to the Internet Protocol (IP).

24. The system of claim 15, wherein the means for transmitting the data packets includes means for transmitting a new data packet about every 200 ms, except for the first data packet created.

25. The system of claim 15, wherein the means for converting the data packets includes:

(a) means for dividing each data packet back into the primary and secondary data samples;

(b) means for extracting the segments and the bit patterns A, BBB, and CCCC for each segment;

(c) look-up means for determining the amount of change between the current and previous segments using the bit pattern BBB;

(d) means for recreating the stream of digital data samples using the direction of change in signal movement (A), the amount of change between successive segments (BBB), and the number of data samples in each segment (CCCC), and the secondary data samples;

(e) means for converting the stream of digital data samples into a destination analog signal; and (f) means for playing back the destination analog signal as each data packet is converted, the data packet being played back referred to as the current packet and the data packet that should be received at the destination immediately after the current packet is received referred to as the next packet.

26. The system of claim 25, wherein the means for playing back the destination analog signal as each data packet is converted includes:

(a) if the next packet is not received late or lost in transmission, then means for playing back the primary data samples portion of the current packet for about 200 ms, followed by means for playing back the primary data samples portion starting at the beginning of the next packet;

(b) if the next packet is received late, then means for playing back the current packet until the next packet is received, which may include playing back a portion of the secondary data samples portion depending on how late the next packet is received, means for determining the location in the next packet at which to begin playing back, and means for playing back the next packet at the determined location; and (c) if the next packet is lost in transmission, then means for playing back the current packet in its entirety, including the secondary data.

* * * * *